US010157727B2

(12) United States Patent
Henstra et al.

(10) Patent No.: US 10,157,727 B2
(45) Date of Patent: Dec. 18, 2018

(54) ABERRATION MEASUREMENT IN A CHARGED PARTICLE MICROSCOPE

(71) Applicant: FEI Company, Hillsboro, OR (US)

(72) Inventors: Alexander Henstra, Utrecht (NL); Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 37 days.

(21) Appl. No.: 15/448,445

(22) Filed: Mar. 2, 2017

(65) Prior Publication Data

US 2018/0254168 A1    Sep. 6, 2018

(51) Int. Cl.
*H01J 37/26* (2006.01)
*H01J 37/147* (2006.01)
*H01J 37/08* (2006.01)

(52) U.S. Cl.
CPC .......... *H01J 37/265* (2013.01); *H01J 37/08* (2013.01); *H01J 37/1472* (2013.01)

(58) Field of Classification Search
CPC ....... H01J 37/265; H01J 37/08; H01J 37/1472
USPC .................. 250/306, 307, 309, 310, 311
See application file for complete search history.

(56) References Cited

U.S. PATENT DOCUMENTS

| 884,345 A | 4/1908 | Stull |
| 5,838,011 A | 11/1998 | Krijn et al. |
| 6,051,834 A * | 4/2000 | Kakibayashi ........... H01J 37/28 250/311 |
| 2004/0031921 A1 | 2/2004 | Kondo et al. |
| 2006/0033037 A1 | 2/2006 | Kawasaki et al. |
| 2006/0219935 A1 | 10/2006 | Henstra |
| 2007/0125945 A1 | 6/2007 | Zande et al. |

(Continued)

OTHER PUBLICATIONS

"Electron Microscope", Wkipedia, Retrieved from the Internet Oct. 15, 2015, http://en.wikipedia.org/wiki/Electron_microscope, 11 pages.

(Continued)

*Primary Examiner* — Nicole Ippolito
(74) *Attorney, Agent, or Firm* — Scheinberg & Associates, P.C.; Michael O. Scheinberg

(57) ABSTRACT

A method of operating a charged particle microscope comprising the following steps:
Providing a specimen on a specimen holder;
Using a source to produce a beam of charged particles;
Passing said beam through an illuminator comprising:
   A source lens, with an associated particle-optical axis;
   A condenser aperture, which is disposed between the source lens and specimen and is configured to define a footprint of said beam upon the specimen;
Irradiating the specimen with the beam emerging from said illuminator;
Using a detector to detect radiation emanating from the specimen in response to said irradiation, and producing an associated image, specifically comprising the following steps:
Choosing a set of emission angles from said source;
For each emission angle in said set, selecting a corresponding sub-beam that emits from the source at that emission angle, and storing a test image formed by that sub-beam, thereby compiling a set of test images corresponding to said set of emission angles;
Analyzing said set of test images to evaluate illuminator aberrations generated prior to said condenser aperture.

20 Claims, 6 Drawing Sheets

(56) References Cited

U.S. PATENT DOCUMENTS

| | | | |
|---|---|---|---|
| 2008/0042074 A1 | 2/2008 | Sato et al. | |
| 2009/0200464 A1 | 8/2009 | Tiemeijer et al. | |
| 2010/0327179 A1 | 12/2010 | Freikszas | |
| 2011/0114852 A1 | 5/2011 | Henstra | |
| 2013/0256531 A1 | 10/2013 | Yoshida et al. | |
| 2014/0061464 A1 | 3/2014 | Lazic et al. | |
| 2014/0312226 A1* | 10/2014 | Boughorbel | G01N 23/225 250/307 |
| 2015/0170876 A1 | 6/2015 | Janssen et al. | |
| 2015/0357155 A1* | 12/2015 | Dohi | H01J 37/147 250/307 |
| 2017/0025243 A1* | 1/2017 | Ren | H01J 37/06 |

OTHER PUBLICATIONS

"Focused Ion Beam", Wkipedia, Retrieved from the Internet Jul. 11, 2016, https://en.wikipedia.org/wiki/Focused_ion_beam, 7 pages.

"Scanning Electron Microscope", Wikipedia. Retrieved from the Internet Jul. 25, 2016, http://en.wikipedia.org/wiki/Scanning_electron_microscope, 23 pages.

"Scanning Helium Ion Microscope", Wikipedia, Retrieved from the Internet on Jul. 25, 2016, http://en.wikipedia.org/wiki/Scanning_Helium_Ion_Microscope, 2 pages.

"Scanning Transmission Electron Microscopy", Wikipedia, Retrieved from the Internet Jul. 25, 2016, http://en.wikipedia.org/wiki/Scanning_transmission_electron_microscopy, 5 pages.

"Stigmator", Wikipedia, Retrieved from the Internet Aug. 18, 2017, http://en.wikipedia.org/wiki/Stigmator, 4 pages.

"Transmission Electron Microscopy", Wikipedia, Retrieved from the Internet Jul. 25, 2016, http://en.wikipedia.org/wiki/Transmission_electron_microscopy, 23 pages.

Escovitz, W.H. et al., "Scanning Transmission Ion Microscope with a Field Ion Source," Proc. Nat. Acad. Sci. USA, May 1975, pp. 1826-1828, vol. 72, No. 5.

FEI Company, "High-resolution imaging on Cs-corrected Titan(TM) 80-300," retrieved from the Internet Aug. 18, 2017, http://www.cnf.umcs.lublin.pl/pdfy/2006_08_HighRex_Imaging_CS_Titan_an.pdf, 8 pages.

Uno, S. et al., "Aberration correction and its automatic control in scanning electron microscopes," Optik/Optics 116 (2005), pp. 438-448 (Elsevier).

Varentsov, D. et al. "First biological images with high-energy proton microscopy", Physica Medica (2013), pp. 208-213, vol. 29.

\* cited by examiner

ABERRATION MEASUREMENT IN A CHARGED PARTICLE MICROSCOPE

The invention relates to a method of operating a charged particle microscope comprising the following steps:
  Providing a specimen on a specimen holder;
  Using a source to produce a beam of charged particles;
  Passing said beam through an illuminator comprising:
    A source lens, with an associated particle-optical axis;
    A condenser aperture, which is disposed between the source lens and specimen and is configured to define a footprint of said beam upon the specimen;
  Irradiating the specimen with the beam emerging from said illuminator;
  Using a detector to detect radiation emanating from the specimen in response to said irradiation, and producing an associated image.

The invention also relates to a charged particle microscope in which such a method can be enacted.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
  In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
  In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
  en.wikipedia.org/wiki/Electron_microscope
  en.wikipedia.org/wiki/Scanning_electron_microscope
  en.wikipedia.org/wiki/Transmission_electron_microscopy
  en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
  en.wikipedia.org/wiki/Focused_ion_beam
  en.wikipedia.org/wiki/Scanning_Helium_Ion_Microscope
  W. H. Escovitz, T. R. Fox and R. Levi-Setti, *Scanning Transmission Ion Microscope with a Field Ion Source*, Proc. Nat. Acad. Sci. USA 72(5), pp. 1826-1828 (1975). www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged-Particle Microscope (CPM) will comprise at least the following components:
  A particle source, such as a Schottky electron source or ion source.
  An illuminator, which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated. In many cases, the (narrow) beam that leaves the illuminator and impinges upon the specimen is referred to as a "probe".
  A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When designed to hold cryogenic specimens, the specimen holder will comprise means for maintaining said specimen at cryogenic temperatures, e.g. using an appropriately connected cryogen vat.
  A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the particular case of a dual-beam microscope, there will be (at least) two sources/illuminators (particle-optical columns), for producing two different species of charged particle. Commonly, an electron column (arranged vertically) will be used to image the specimen, and an ion column (arranged at an angle) can be used to (concurrently) modify (machine/process) and/or image the specimen, whereby the specimen holder can be positioned in multiple degrees of freedom so as to suitably "present" a surface of the specimen to the employed electron/ion beams.

In the case of a transmission-type microscope (such as a (S)TEM, for example), a CPM will specifically comprise:
  An imaging system (imaging particle-optical column), which essentially takes charged particles that are transmitted through a specimen (plane) and directs (focuses) them onto analysis apparatus, such as a detection/imaging device, spectroscopic apparatus (such as an EELS device), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

A charged particle microscope, such as a SEM or STEM, preferably employs a high brightness source. In the case of electrons, one such source is a Cold Field Emission source (also referred to as a Cold Field Emission Gun or CFEG). For such a source, the source size and angular current density are very small, but the brightness is very high, and since the source is operated at room temperature (or a temperature close thereto) minimal thermal energy spread is introduced. A similar source producing ions is a Liquid Metal Ion Source, for example.

The angular current density of a CFEG presents a challenge, in that it is about two orders of magnitude smaller than that of a conventional Schottky FEG, for example. This means that, for a given beam current, the solid angle focused by the (conventionally present) source lens (gun lens) must be ca. two orders of magnitude larger for a CFEG than for a Schottky FEG. As a result, the (ultimate) effect of the source lens on beam quality becomes significant, due to increased aberrations—both intrinsic (e.g. chromatic and spherical) and parasitic (e.g. 3-fold astigmatism and coma). When using a CFEG (or similarly small source), it therefore becomes important—especially for so-called "Cs-corrected" microscopes—to accurately measure (and correct) aberrations in the source lens.

It is an object of the invention to address this issue. More specifically, it is an object of the invention to provide a method/apparatus for accurately measuring aberrations in the source lens of a charged particle microscope.

These and other objects are achieved in a method as set forth in the opening paragraph above, characterized by:
Choosing a set of emission angles from said source;
For each emission angle in said set, selecting a corresponding sub-beam that emits from the source at that emission angle, and storing a test image formed by that sub-beam, thereby compiling a set of test images corresponding to said set of emission angles;
Analyzing said set of test images to evaluate illuminator aberrations generated prior to said condenser aperture.

In investigations leading to the invention, the inventors realized that, when using a relatively small particle source with a (very) small angular current density, the employed source lens (gun lens) needs to capture a relatively large angular extent of emitted flux from the source. However, since aberrations tend to increase in severity as one moves away from paraxial angles and progresses toward larger (more peripheral) acceptance angles, use of a small source will therefore imply much more significant source lens aberrations. In contrast, when using conventional (larger) sources, the source lens aberrations are essentially negligible when compared to the aberrations in the (conventionally named) objective lens located between the condenser aperture and the specimen. Accordingly, up to now, there was no pressing need to investigate source lens aberrations. So, for example, in the prior art, the so-called "Zemlin Tableau" or "STEM Tableau" method of investigating (S)TEM aberrations concentrated solely on aberrations in the final "probe-forming lens(es)"—such as the objective lens (plus an aberration corrector for the objective lens, if present)—and did not/could not provide any information on aberrations prior to/upstream of this level. In contrast, the present invention examines aberrations that occur in the particle-optical column above the condenser aperture, providing a unique insight into the behavior of this part of the column.

The set of test images generated by the present invention essentially allows a path-specific analysis of imaging behavior/aberrations in the "upper illuminator"—located prior to (upstream of) the condenser aperture—whereby a particular path through this upper illuminator is permeated by each particular sub-beam at each given emission angle. Collecting a set of images corresponding to a set of such paths/sub-beams essentially allows compilation of a "map" of aberration behavior for these various paths. The set of test images can, for example, be analyzed by (proprietary) software, which can use fitting routines to determine (lower-order) coefficients of aberration polynomials in a mathematical aberration model. Using the present invention to determine the aberrations generated in the upper illuminator, and using a separate technique (such as the aforementioned "Zemlin Tableau" method) to analyze aberrations generated in the lower particle-optical column (below the level of the condenser aperture) allows better overall alignment and performance of the microscope, since it concurrently allows independent corrective action to be taken above and below the condenser aperture (see below). For more information on the underlying mathematics of deriving aberrations from image series, see, for example, the article by S. Uno et al., "Aberration correction and its automatic control in scanning electron microscopes", Optik/Optics 116 (2005), pp. 438-448 (Elsevier).

It should be noted that, when using a small-emission-area source (such as a CFEG), aberrations arising from the source lens will generally be much more significant than aberrations arising from a (conventionally present) condenser lens located just above the condenser aperture. This is because the source lens for such a source will typically have a focal length (e.g. 1-2 mm) of the order of 10 times smaller than that of said condenser lens (e.g. 10-20 mm), with a respective capture angle that is of the order of 10 times larger. Accordingly, aberrations arising from the source lens will tend to be about an order of magnitude larger than those arising from the condenser lens. Moreover, the present invention encompasses techniques that can further reduce the relative contribution of aberrations from the condenser lens—see FIG. 2E, for example—in which case the invention can purely concentrate on source lens aberrations, if desired.

The present invention employs a mechanism that allows individual sub-beams to be selected as desired, and such a mechanism can be embodied in various ways. For example:
One such mechanism involves selectively shifting the condenser aperture in a lateral direction normal to the system's particle-optical axis, so as to position the aperture in the path of a given sub-beam (and block the path of other, surrounding sub-beams)—see FIG. 2B, for example. If desired, a supplemental beam deflector can be used to limit aberrations generated by the objective lens in such a set-up—see FIG. 2C, for example.
Another (alternative or complementary) approach employs a (magnetic and/or electrostatic) beam deflector, located between the source and condenser aperture, to produce a selectable lateral beam deflection, thereby laterally shifting the beam footprint upon the condenser aperture, and thus deciding which portion (sub-beam) of that footprint passes through the aperture. See FIGS. 2D and 2E, for example.

In an advantageous embodiment of the invention, the set of test images is compiled for a substantially amorphous portion of the specimen. An amorphous specimen (or an amorphous portion [such as the edges and/or contaminant carbon layer] of a crystalline specimen) will not have a selective effect on particular Fourier frequencies in the associated image(s), which allows more accurate (quantitative) aberration determination.

In an advantageous embodiment of the invention, for a given emission angle in said set, (at least) two test images are acquired, at (at least) two different focus settings (e.g. at under-focus and over-focus; or at in-focus and out-of-focus; or at under-focus, in-focus and over-focus). If these different test images at different focus settings are Fourier-transformed, divided one by the other, and then inverse-Fourier-transformed, this will yield valuable information on the associated "nominal" image, making it easier to more accurately determine what aberrations are present. See, in this regard, the aforementioned Uno journal article, for example.

Once aberrations have been qualified/quantified using the invention, it will generally be desirable to (automatically) counteract them. This can be done using an aberration corrector in the illuminator, which may comprise one or more of the following components/aspects, for example:
  A beam tilt correction element.
  A stigmator. See, for example, the following Wikipedia link: en.wikipedia.org/wiki/Stigmator
  A Cc-corrector, for addressing chromatic aberration (which tends to become more dominant at relatively low beam acceleration voltages, e.g. below 100 kV). An embodiment of a Cc-corrector can be found in U.S. Pat. No. 8,884,345, for example (which has an inventor in common with the present invention).
  A Cs-corrector, for addressing spherical aberration (which tends to be more dominant at relatively high beam acceleration voltages, e.g. above 100 kV). Some information on Cs-correction can, for example, be gleaned from the following publication (from the assignee of the present invention):
  www.cnf.umcs.lublin.pl/pdfy/2006_08_HighRex_Imaging_CS_Titan_an.pdf As already referred to above, the present invention is particularly advantageous when the employed source is a CFEG. However, this is not the only type of source that can be used with the invention, and other source types include, for example, an electron impact ionization source [of which a particular form is a Nano Aperture Ion Source (NAIS)], a Liquid Metal Ion Source (LMIS) [already alluded to above], and a field ionization source.

The skilled artisan will appreciate that the present invention can be applied in a TEM, STEM, SEM, FIB-SEM, and various other types of CPM.

The invention will now be elucidated in more detail on the basis of exemplary embodiments and the accompanying schematic drawings, in which:

FIG. 1 renders a longitudinal cross-sectional view of an embodiment of a CPM in which the present invention is implemented.

In the Figures, where pertinent, corresponding parts are indicated using corresponding reference symbols. It should be noted that, in general, the Figures are not to scale.

Embodiment 1

Figure 1:
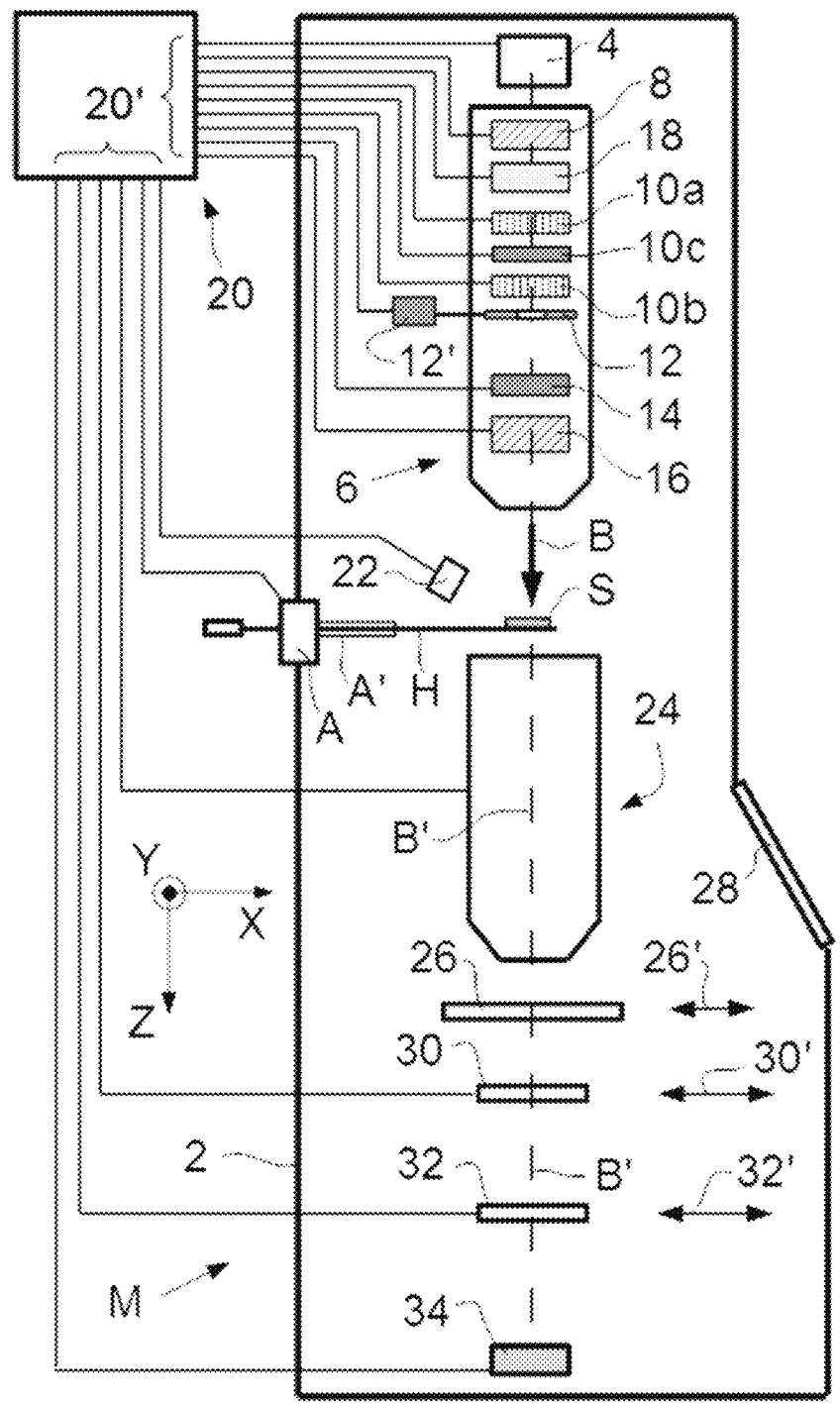

FIG. 1 is a highly schematic depiction of an embodiment of a charged-particle microscope M in which the present invention is implemented; more specifically, it shows an embodiment of a transmission-type microscope M, which, in this case, is a TEM/STEM (though, in the context of the current invention, it could just as validly be a SEM, or an ion-based microscope, for example). In the Figure, within a vacuum enclosure 2, a CFEG electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). In this particular case, the illuminator 6 comprises:
  A source lens (gun lens) 8, which serves inter alia to magnify the source 4;
  A compound condenser lens 10a/10b, with an upper element 10a that serves to create a small beam spot size (narrow beam probe on specimen S), and a lower element 10b that acts as a collimating lens;
  A condenser aperture 12;
  A scan deflector 14;
  An objective lens 16.

The illuminator also contains other items 10c, 18. Item 10c will be discussed below. Item 18 is an aberration corrector, which can be configured to mitigate one or more types of aberration that have been identified/quantified using the invention (see discussion above).

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be irradiated/imaged/inspected by the electron beam B traveling along axis B' (in the Z direction) (and/or allows scanning motion to be performed, as an alternative to beam scanning using deflector 14). If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example (EELS=Electron Energy-Loss Spectroscopy).

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

Figure 2A:
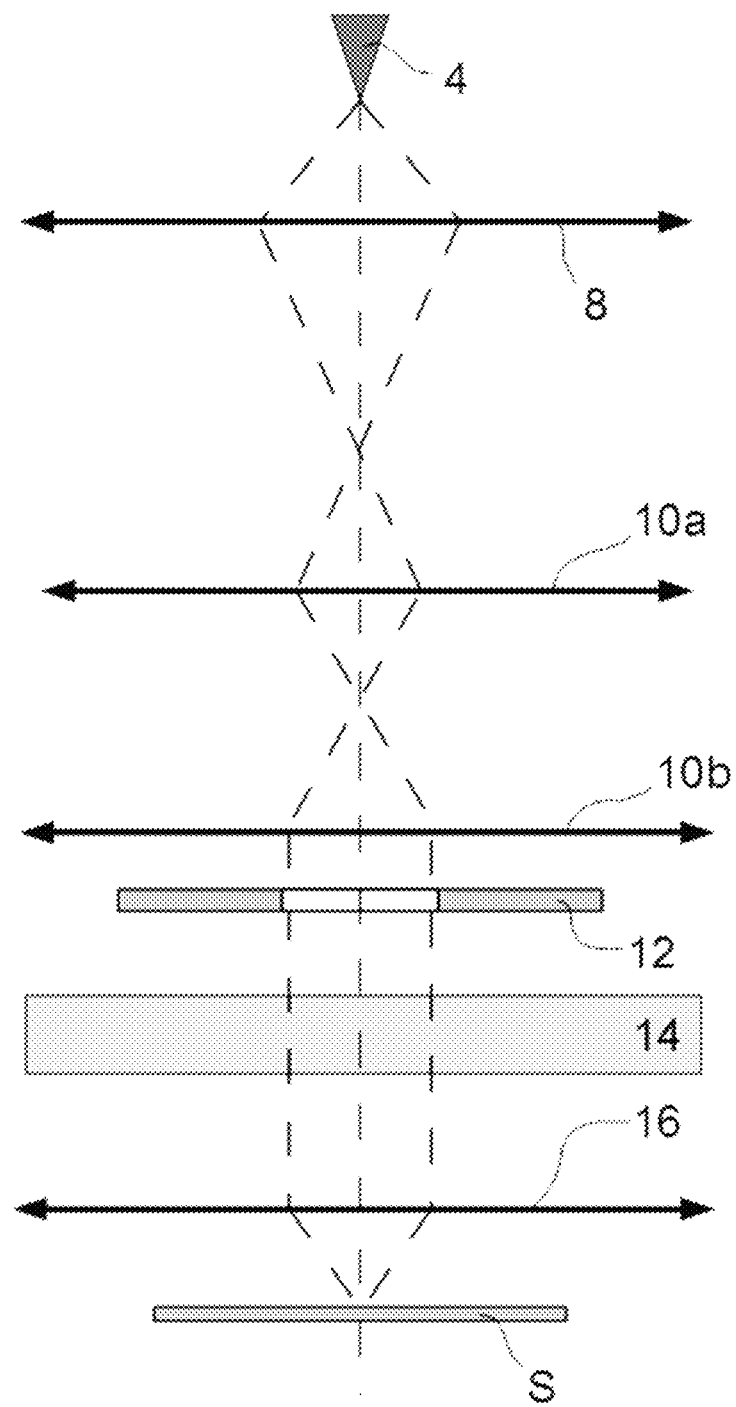
FIG. 2A shows a magnified view of a portion of FIG. 1.

Turning now to FIG. 2A, this shows a magnified view of a portion of the subject of FIG. 1. More particularly, it shows the source 4 and certain elements of the illuminator 6, whereby items 10c and 18 have been omitted for now. The dashed line shows a nominal (central/paraxial) (sub-)beam path through the various elements of the illuminator 6.

Figure 2B:
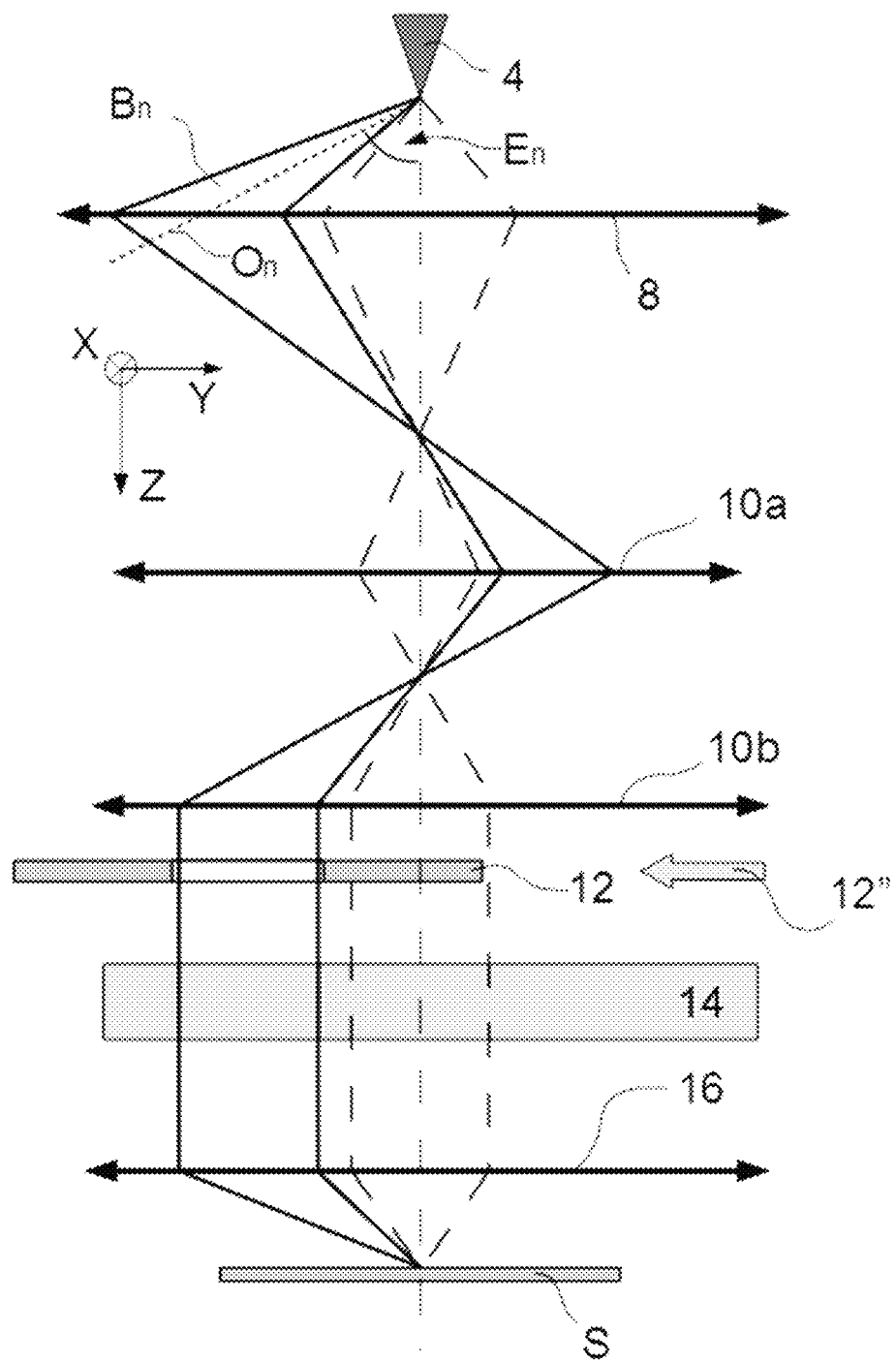
FIG. 2B represents a modified version of FIG. 2A, and serves to illustrate the operating principle of a particular embodiment of the invention.

In FIG. 2B, the condenser aperture 12 has been displaced laterally (see arrow 12") parallel to the indicated Y direction (whereby the axis B' extends parallel to Z)—though it can also be displaced parallel to X, so as to position aperture 12 at a variety of (X,Y) coordinates about axis B'. This can, for example, be done using an attached actuator mechanism 12' (see FIG. 1), which may be electric in nature, e.g. comprising a piezoelectric actuator or stepper motor, for example. Laterally shifting the condenser aperture 12 in this manner causes selection of a particular sub-beam $B_n$—which propagates at an associated emission angle $E_n$ defined relative to a median axis $O_n$—by allowing the indicated sub-beam $B_n$ to proceed toward the specimen S while concurrently blocking other component sub-beams of the beam B (at other emission angles). One of the detectors 22, 30, 32, 34 can be used to capture a test image $I_n$ of (an irradiated portion of) specimen S corresponding to this sub-beam $B_n$, and this test image $I_n$ can be stored by controller 20 in a memory. By successively positioning the condenser aperture 12 at a variety of different (X,Y) coordinates about axis B'—corresponding to a set $\{E_n\}$ of different emission angles—one can acquire a commensurate set $\{I_n\}$ of test images of (a portion of) specimen S.

Figure 2C:
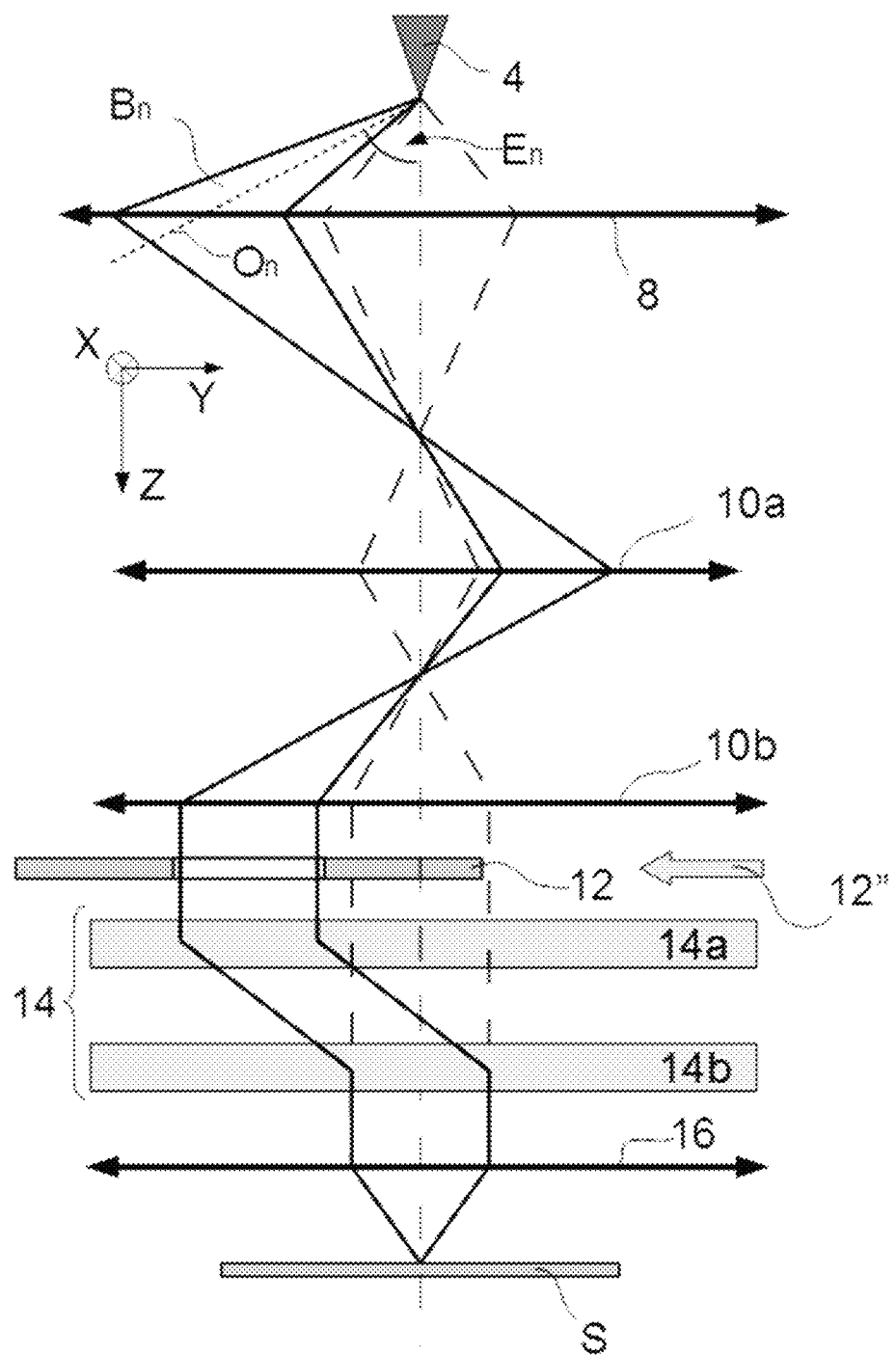
FIG. 2C shows a variant of the situation depicted in FIG. 2B.

A potential issue with the set-up depicted in FIG. 2B is that, by directing (certain) sub-beams through the outer reaches of objective lens 16, it tends to increase aberration contributions from this lens. To address this effect, one can make use of an architecture as depicted in FIG. 2C, in which scan deflector 14—here embodied as a double deflector, with components 14a and 14b—can be invoked to direct each sub-beam selected by condenser aperture 12 through a central portion of objective lens 16. Avoiding the outer regions of objective lens 16 in this manner significantly decreases aberration production therein.

Figure 2D:
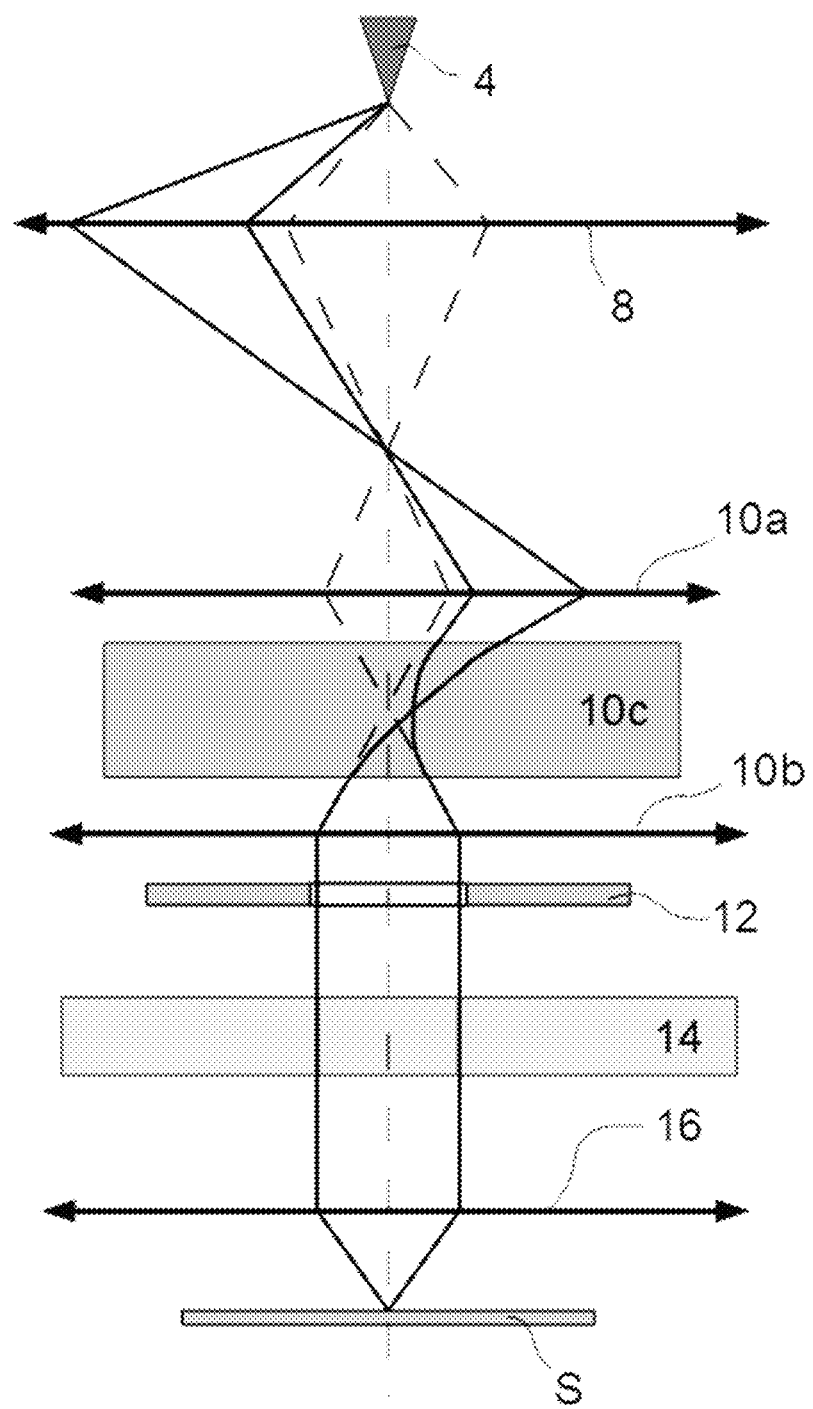
FIG. 2D represents a different modified version of FIG. 2A, and serves to illustrate the operating principle of a different embodiment of the invention.

As an alternative/supplement to the situation shown in FIGS. 2B/2C, one can also use an embodiment such as that illustrated in FIG. 2D, for instance. This shows a situation that is largely identical to that in FIG. 2B, except in that, instead of shifting the condenser aperture 12, sub-beam selection occurs using an adjustable deflector 10c—which can be used to divert a sub-beam at any given emission angle through the (on-axis) condenser aperture 12. As here depicted, the deflector 10c is conveniently located at/near a beam crossover point between condenser elements 10a and 10b, though this is not strictly necessary, and the deflector 10c could instead be located somewhere else between source lens 8 and condenser aperture 12. The deflector 10c may comprise electrostatic and/or magnetic deflector elements, as desired.

Figure 2E:
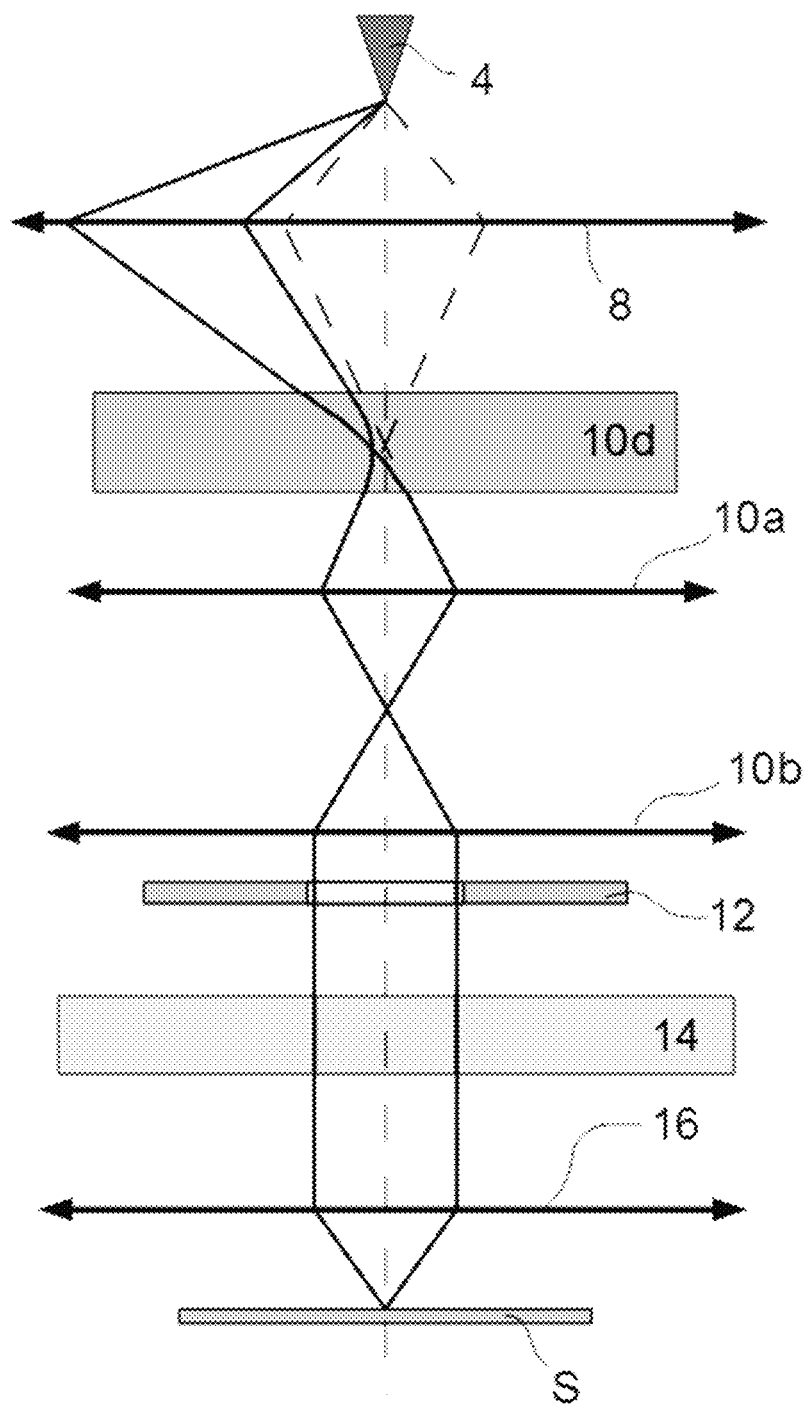
FIG. 2E shows a variant of the situation depicted in FIG. 2D.

Although the selected sub-beam in FIG. 2D passes through a central portion of objective lens 16, certain sub-beams in this embodiment will pass through the outer reaches of upper condenser lens 10a, which tends to increase aberration contributions from this lens. To address this effect, one can make use of an architecture as depicted in FIG. 2E, in which use is made of a deflector 10d that is positioned upstream of upper condenser lens 10a, and can be invoked to direct each selected sub-beam through a central portion of the whole condenser lens 10a/10b. Avoiding the outer regions of condenser lens 10a/10b in this manner significantly decreases aberration production therein.

The skilled artisan will understand that, in practice, one can make use of a combination/hybrid of the approaches illustrated in FIGS. 2B-2E, according to choice.

The invention claimed is:

1. A method of operating a charged particle microscope, comprising:
   providing a specimen on a specimen holder;
   using a source to produce a beam of charged particles;
   passing said beam through an illuminator comprising:
      a source lens, with an associated particle-optical axis, and
      a condenser aperture, which is disposed between the source lens and specimen and is configured to define a footprint of said beam upon the specimen;
   irradiating the specimen with the beam emerging from said illuminator;
   using a detector to detect radiation emanating from the specimen in response to said irradiation, and producing an associated image;
   choosing a set of emission angles from said source;
   for each emission angle in said set, selecting a corresponding sub-beam that emits from the source at that emission angle, and storing a test image formed by that sub-beam, thereby compiling a set of test images corresponding to said set of emission angles; and
   analyzing said set of test images to evaluate illuminator aberrations generated prior to said condenser aperture.

2. The method of claim 1, wherein said sub-beam selection comprises shifting said condenser aperture in a lateral direction normal to said particle-optical axis.

3. The method of claim 2, wherein said sub -beam selection comprises using a beam deflector, located between said source lens and condenser aperture, to produce a selectable lateral beam deflection.

4. The method of claim 2, wherein said set of test images are of a substantially amorphous portion of said specimen.

5. The method of claim 2, wherein, for a given emission angle in said set, two test images are acquired, at two different focus settings.

6. The method of claim 2, comprising:
   providing a source lens aberration corrector in said illuminator, between said source lens and condenser aperture; and
   activating said corrector to mitigate said aberrations.

7. The method of claim 2, wherein said source is selected from the group consisting of a Cold Field Emitter Gun (CFEG), an electron impact ion source, a Nano Aperture Ion Source (NAIS), a Liquid Metal Ion Source (LMIS), and a field ionization source.

8. The method of claim 1, wherein said sub-beam selection comprises using a beam deflector, located between said source lens and condenser aperture, to produce a selectable lateral beam deflection.

9. The method of claim 8, wherein said set of test images are of a substantially amorphous portion of said specimen.

10. The method of claim 8, wherein, for a given emission angle in said set, two test images are acquired, at two different focus settings.

11. The method of claim 8, comprising:
    providing a source lens aberration corrector in said illuminator, between said source lens and condenser aperture; and
    activating said corrector to mitigate said aberrations.

12. The method of claim 8, wherein said source is selected from the group consisting of a Cold Field Emitter Gun (CFEG), an electron impact ion source, a Nano Aperture Ion Source (NAIS), a Liquid Metal Ion Source (LMIS), and a field ionization source.

13. The method of claim 1, wherein said set of test images are of a substantially amorphous portion of said specimen.

14. The method of claim 13, wherein, for a given emission angle in said set, two test images are acquired, at two different focus settings.

15. The method of claim 13, comprising:
    providing a source lens aberration corrector in said illuminator, between said source lens and condenser aperture; and
    activating said corrector to mitigate said aberrations.

16. The method of claim 13, wherein said source is selected from the group consisting of a Cold Field Emitter Gun (CFEG), an electron impact ion source, a Nano Aperture Ion Source (NAIS), a Liquid Metal Ion Source (LMIS), and a field ionization source.

17. The method of claim 1, wherein, for a given emission angle in said set of emission angles, two test images are acquired, at two different focus settings.

18. The method of claim 1, comprising:
    providing a source lens aberration corrector in said illuminator, between said source lens and condenser aperture; and
    activating said corrector to mitigate said aberrations.

19. The method of claim 1, wherein said source is selected from the group consisting of a Cold Field Emitter Gun (CFEG), an electron impact ion source, a Nano Aperture Ion Source (NAIS), a Liquid Metal Ion Source (LMIS), and a field ionization source.

20. A charged particle microscope comprising:
    a specimen holder, for holding a specimen;
    a source, for producing a beam of charged particles;
    an illuminator comprising:
       a source lens, with an associated particle-optical axis, and
       a condenser aperture, disposed between the source lens and specimen holder and configured to define a footprint of said beam upon said specimen;
    a detector, for detecting radiation emanating from the specimen in response to irradiation by said beam, and producing an associated image; and
    a programmable controller, for automatically controlling given operations of the microscope,
    said controller is configured to:
    choose a set of emission angles from said source;
    for each emission angle in said set, select a corresponding sub-beam that emits from the source at that emission angle, and store a test image formed by that sub-beam, thereby compiling a set of test images corresponding to said set of emission angles; and
    analyze said set of test images to evaluate illuminator aberrations generated prior to said condenser aperture.

* * * * *